(12) United States Patent
Lin et al.

(10) Patent No.: US 11,594,576 B2
(45) Date of Patent: Feb. 28, 2023

(54) SEMICONDUCTOR DEVICE, MEMORY CELL AND METHOD OF FORMING THE SAME

(71) Applicant: Taiwan Semiconductor Manufacturing Company, Ltd., Hsinchu (TW)

(72) Inventors: Yu-Chao Lin, Hsinchu (TW); Tung-Ying Lee, Hsinchu (TW); Yuan-Tien Tu, Chiayi County (TW); Jung-Piao Chiu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 206 days.

(21) Appl. No.: 17/092,313

(22) Filed: Nov. 8, 2020

(65) Prior Publication Data
US 2022/0037399 A1 Feb. 3, 2022

Related U.S. Application Data

(60) Provisional application No. 63/058,509, filed on Jul. 30, 2020.

(51) Int. Cl.
*H01L 27/24* (2006.01)
*H01L 45/00* (2006.01)

(52) U.S. Cl.
CPC ........ *H01L 27/2427* (2013.01); *H01L 45/124* (2013.01); *H01L 45/1253* (2013.01); *H01L 45/14* (2013.01); *H01L 45/1691* (2013.01)

(58) Field of Classification Search
CPC .............. H01L 27/2427; H01L 45/124; H01L 45/1253; H01L 45/14; H01L 45/1691; H01L 27/222; H01L 45/1233; H01L 45/04; H01L 45/06; H01L 45/08; H01L 45/16
See application file for complete search history.

(56) References Cited

U.S. PATENT DOCUMENTS

2020/0044148 A1* 2/2020 Trinh ................... G11C 13/003
2020/0136038 A1* 4/2020 Manfrini ............. H01L 45/1608

* cited by examiner

*Primary Examiner* — David Vu
(74) *Attorney, Agent, or Firm* — JCIPRNET

(57) ABSTRACT

A memory cell includes a bottom electrode, a memory element, spacers, a selector and a top electrode. The memory element is located on the bottom electrode and includes a first conductive layer, a second conductive layer and a storage layer. The first conductive layer is electrically connected to the bottom electrode. The second conductive layer is located on the first conductive layer, wherein a width of the first conductive layer is smaller than a width of the second conductive layer. The storage layer is located in between the first conductive layer and the second conductive layer. The spacers are located aside the second conductive layer and the storage layer. The selector is disposed on the spacers and electrically connected to the memory element. The top electrode is disposed on the selector.

20 Claims, 10 Drawing Sheets

SEMICONDUCTOR DEVICE, MEMORY CELL AND METHOD OF FORMING THE SAME

CROSS-REFERENCE TO RELATED APPLICATION

This application claims the priority benefit of U.S. provisional application Ser. No. 63/058,509, filed on Jul. 30, 2020. The entirety of the above-mentioned patent application is hereby incorporated by reference herein and made a part of this specification.

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging. Semiconductor processing for fabrications of the semiconductor devices and ICs continues to evolve towards increasing device-density and higher numbers of semiconductor electronic components (e.g., transistors used for logic processing and memories used for storing information) of ever decreasing device dimensions. For example, the memories include non-volatile memory devices, where the non-volatile memory devices are capable of retaining data even after power is cut off. The non-volatile memory devices include resistive random-access memories and/or phase change random access memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
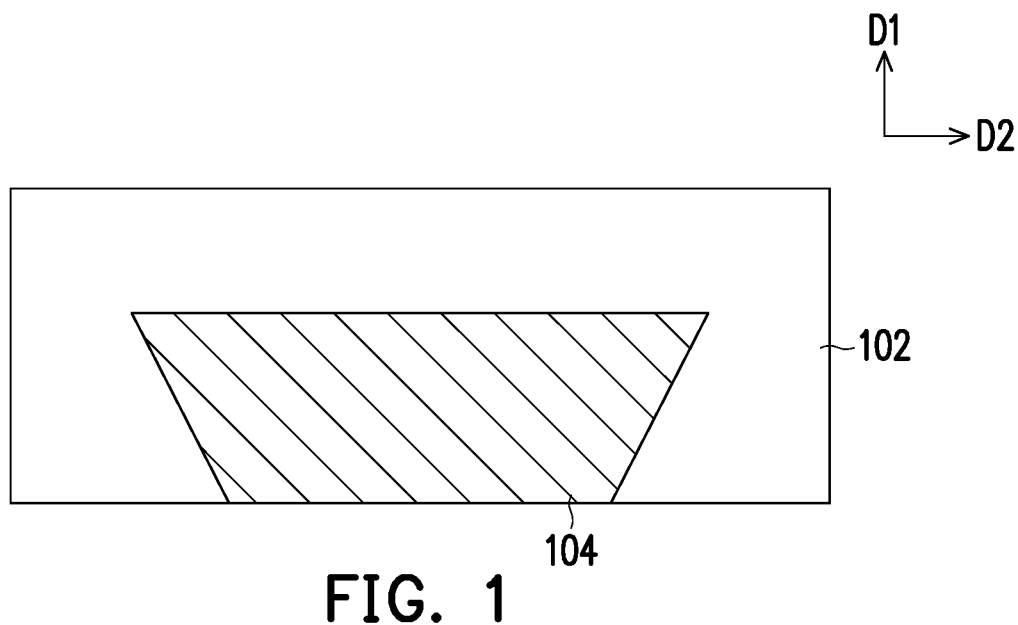
FIG. 1 to FIG. 8 are schematic sectional views of various stages in a method of forming a memory cell in accordance with some embodiments of the present disclosure

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on" "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a method of forming a memory cell which includes forming a selector on a memory element (or device). In a memory cell implemented with a selector (e.g., an ovonic threshold switch (OTS)), the selector is electrically connected to a corresponding memory element, so as to control the corresponding memory element. The conventional method of forming the memory element will occupy a large space, and it will be difficult to achieve a high pattern density. For example, the conventional method requires patterning and forming the memory element in a first layer, while forming the selector in another layer over the first layer, and forming conductive pillars for electrically connecting the selector to the memory element. The conventional method is also really time consuming, and has low electrical current delivery performance due to a large contact area of the top and bottom conductive layers of the memory element with other interconnection structures.

In accordance with some embodiments discussed herein, the dimensions of the memory element are scaled down in favor of high electrical current delivery performance for memory operation, and to achieve high pattern density, By designing the memory element in such a small scale, the selector may be formed over and around the memory element in the same film layer through a self-aligned process. As such, high density memory cells with high operation current may be achieved, while the manufacturing process steps may be reduced.

FIG. 1 to FIG. 8 are schematic sectional views of various stages in a method of forming a memory cell in accordance with some embodiments of the present disclosure. Referring to FIG. 1, a bottom electrode 104 is provided. For example, the bottom electrode 104 is embedded in a dielectric layer 102. In some embodiments, the dielectric layer 102 includes a dielectric material, such as silicon oxide, silicon nitride, silicon oxynitride, silicon carbonitride, silicon carbide oxynitride, spin-on glass (SOG), phosphosilicate glass (PSG), borophosphosilicate glass (BPSG), FSG, carbon doped silicon oxide (e.g., SiCOH), polyimide, a spin-on dielectric material, a low-k dielectric material, or the like, and/or a combination thereof. It should be noted that the low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof.

In some embodiment, the dielectric layer 102 is formed by chemical vapor deposition (CVD) (e.g., flowable chemical vapor deposition (FCVD), plasma-enhanced chemical vapor deposition (PECVD), high density plasma CVD (HDPCVD) or sub-atmospheric CVD (SACVD)), molecular layer deposition (MLD), spin-on, sputtering, or other suitable methods. In one embodiment, the dielectric layer 102 is a one-layer structure. In some other embodiments, the dielectric layer 102 is a multi-layer structure. The disclosure is not limited thereto. In some embodiments, the dielectric layer 102 serves as an insulating layer, and may be referred as an inter-metal dielectric (IMD) layer.

As illustrated in FIG. 1, the bottom electrode 104 is formed in the dielectric layer 102 by a single damascene process. For example, an opening (not shown) is formed in the dielectric layer 102, and the opening is filled with a conductive material. Thereafter, a planarization process (e.g., a chemical-mechanical planarization (CMP) process) is performed to remove excessive conductive material, thereby forming the bottom electrode 104. In a subsequent step, further dielectric materials (part of the dielectric layer 102) may be formed over the bottom electrode 104, so that the bottom electrode 104 is embedded in the dielectric layer 102.

In some embodiments, the bottom electrode 104 is electrically coupled to an overlying structure (e.g. coupled to a first conductive layer of a memory element formed in subsequent steps). In certain embodiments, the bottom electrode 104 is configured to transmit the voltage applied to the bottom electrode 104 to a memory element located thereon. The bottom electrode 104 may be a single-layer structure (of one material) or a multilayer structure (of two or more different structure), and may be formed using CVD, atomic layer deposition (ALD), physical vapor deposition (PVD), a combination thereof, or the like. A material of the bottom electrode 104, for example, includes aluminum (Al), Copper (Cu), tungsten (W), some other low resistance material, or a combination thereof. The bottom electrode 104 may have a round, square, or rectangular profile from a top view.

In some alternative embodiments, a barrier layer (not shown) is optionally formed between the bottom electrode 104 and the dielectric layer 102. For example, the barrier layer is located at the sidewalls of the bottom electrode 104 to physically separate the bottom electrode 104 and the dielectric layer 102. In some embodiments, the barrier layer includes a material to prevent the bottom electrode 104 from diffusing to the adjacent layers. The material of the barrier layer may include Ti, Ta, TiN, TaN, or other suitable material, and may be formed using CVD, ALD, PVD, a combination thereof, or the like. Furthermore, the barrier layer has a material different from that of the bottom electrode 104. For example, in one embodiment, the barrier layer includes TaN while the bottom electrode 104 includes TiN.

Figure 2:
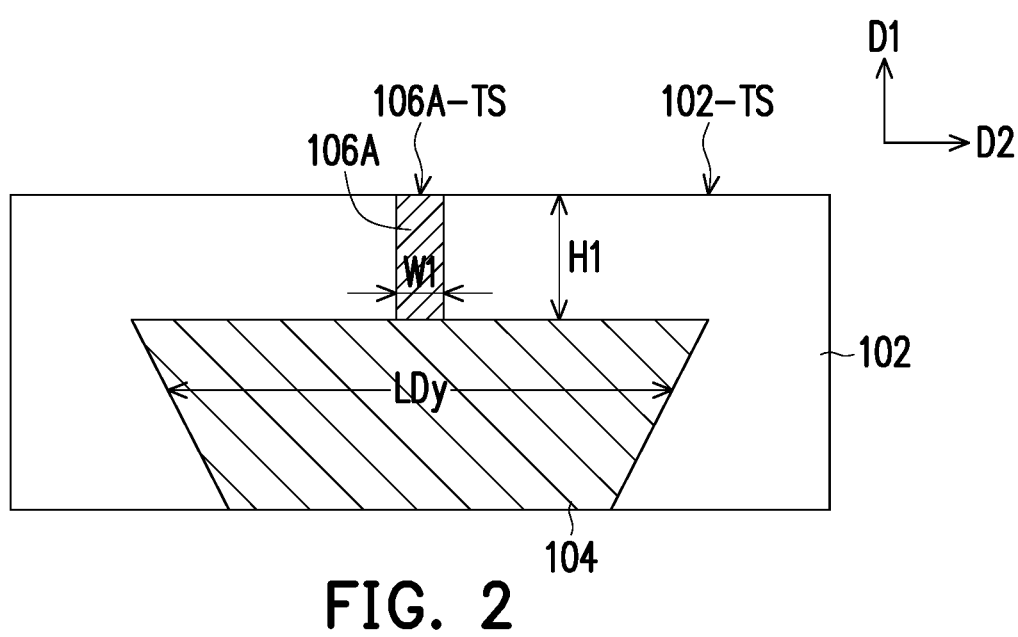
Figure 5:
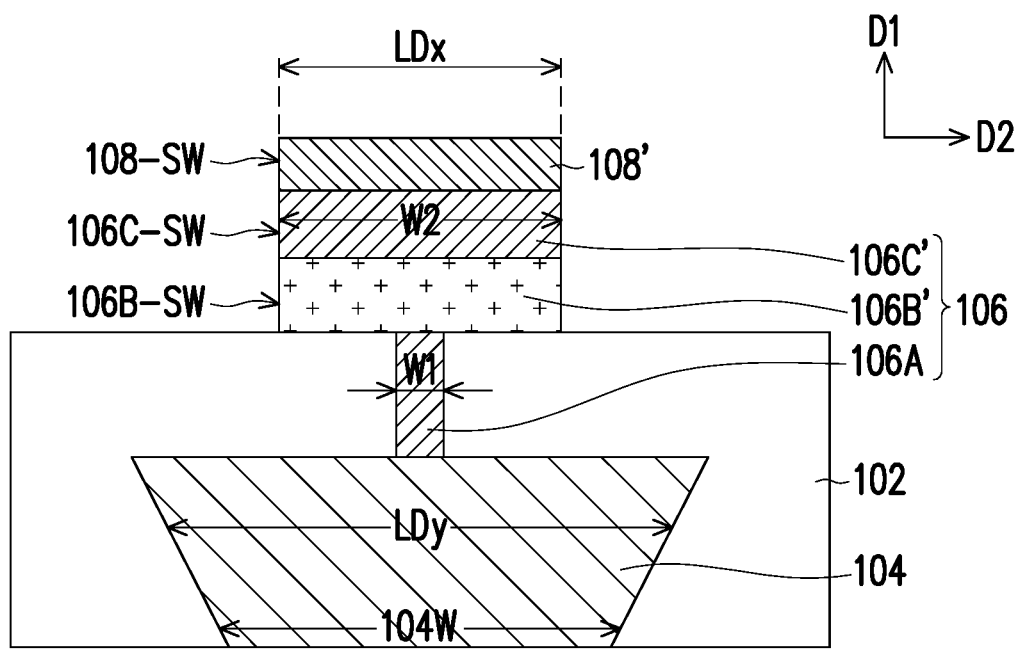

After forming the dielectric layer 102 and the bottom electrode 104, various steps of forming a memory element 106 (as illustrated in FIG. 5) on the bottom electrode 104 will be described. Referring to FIG. 2, a first conductive layer 106A (or a conductive pillar) is formed on the bottom electrode 104 and within the dielectric layer 104. For example, in some embodiments, the dielectric layer 102 is patterned to form openings (not shown) revealing a top surface of the bottom electrode 104. Thereafter, a conductive material is filled into the opening of the dielectric layer 102 to form the first conductive layer 106A. In some embodiments, a planarization process (e.g., a chemical-mechanical planarization (CMP) process) is performed to remove excessive conductive material, so that a top surface 106A-TS of the first conductive layer 106A is coplanar (or aligned) with a top surface 102-TS of the dielectric layer 102.

As further illustrated in FIG. 2, the first conductive layer 106A is stacked up over the bottom electrode 104 along a first direction D1. In some embodiments, the first conductive layer 106A has a pillar-like structure. In other words, a width W1 of the first conductive layer 106A measured along a second direction D2 is smaller than a height H1 of the first conductive layer 106A measured along the first direction D1, wherein the first direction D1 is perpendicular to the second direction D2. In certain embodiments, the first conductive layer 106A is formed to be physically and electrically connected to the bottom electrode 104. Furthermore, the first conductive layer 106A may include a conductive material, such as Ti, Co, Cu, AlCu, W, TiN, TiW, TiAl, TiAlN, TaN, Pt, or a combination thereof, and may be formed by any suitable method, such as CVD, PVD, or the like. In some embodiments, the height H1 (or thickness) of the first conductive layer 106A measured along the first direction D1 is about 50 nm to 80 nm. In some embodiments, the width W1 of the first conductive layer 106 measured along the second direction D2 is about 5 nm to 20 nm. In certain embodiments, the width W1 of the first conductive layer 106 is smaller than a lateral dimension LDy of the bottom electrode 104. For example, a ratio (W1:LDy) of the width W1 to the lateral dimension LDy is around 1:7 to 1:20. By keeping the ratio (W1:LDy) in such a range, a very small contact area is obtained, and higher electrical current delivery (for memory operation) may be achieved.

Figure 3:
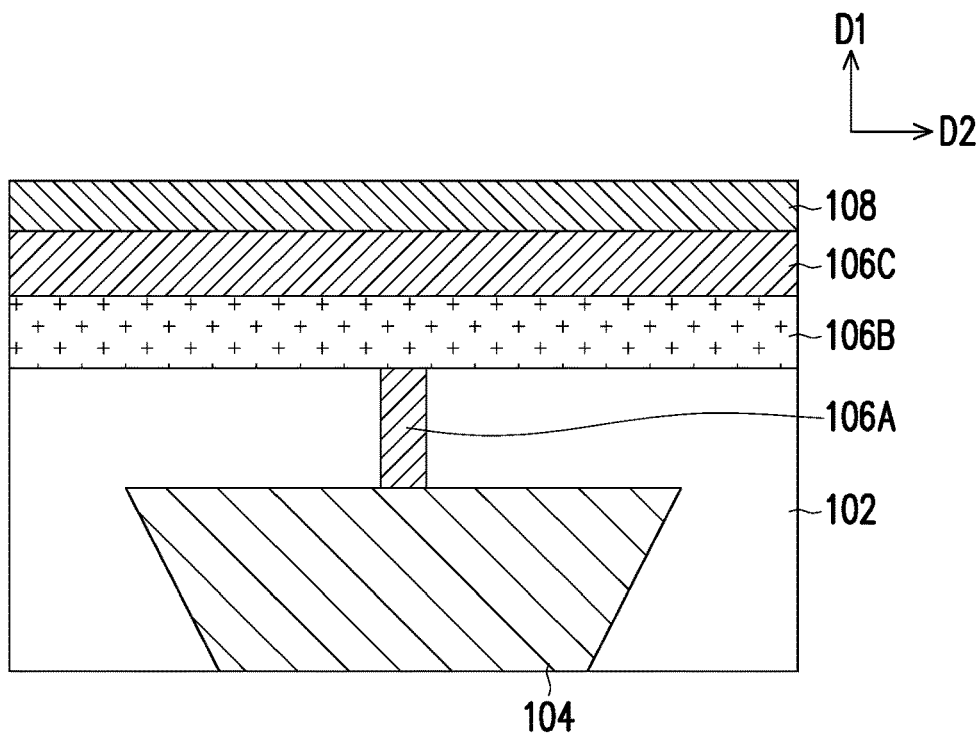

Referring to FIG. 3, in a subsequent step, a storage element material 106B, a conductive material 106C and a metallic material 108 are sequentially formed over the dielectric layer 102 and over the first conductive layer 106A. For example, the storage element material 106B, the conductive material 106C and the metallic material 108 are sequentially stacked up along the first direction D1 and are extending along a second direction D2.

In some embodiments, the storage element material 106B (or high-k layer) is conformally formed over the top surface 102-TS of the dielectric layer 102 and over the top surface 106A-TS of the first conductive layer 106A. For example, the storage element material 106B is connected to and in physical contact with the first conductive layer 106A. The storage element material 106B is located in between the first conductive layer 106A and the conductive material 106C, and may be formed by any suitable method, such as PVD, ALD, or the like. In some embodiments, the storage element material 106B includes a variable resistance dielectric material (also referred to as a resistance changeable material) used for the resistive random access memory (RRAM) element or device. For example, the variable resistance dielectric material includes a transition metal oxide material, such as hafnium oxide (such as HfO or $HfO_2$, etc.), niobium oxide ($NbO_x$), lanthanum oxide ($LaO_x$), gadolinium oxide ($GdO_x$), vanadium oxide ($VO_x$), yttrium oxide ($YO_x$), zirconium oxide ($ZrO_x$), titanium oxide ($TiO_x$), tantalum oxide ($TaO_x$), nickel oxide ($NiO_x$), tungsten oxide ($WO_x$), chromium oxide ($CrO_x$), copper oxide ($CuO_x$), cobalt oxide (CoO$_x$) or iron oxide (FeO$_x$), and combination thereof. The storage element material 106B may have a thickness of about 20 nm to 50 nm.

In some embodiments, the conductive material 106C is conformally formed on the storage element material 106B, and is sandwiched in between the storage element material 106B and the metallic material 108. For example, the conductive material 106C is connected to the storage element material 106B. In some embodiments, the conductive material 106C includes conductive materials, such as Ti, Co, Cu, AlCu, W, TiN, TiW, TiAl, TiAlN, TaN, Pt, the like, or a combination thereof. In one embodiment, the material of the conductive material 106C and the material of the first conductive layer 106A are the same. For example, the conductive material 106C and the first conductive layer 106A are both TiN. In an alternative embodiment, the materials of the conductive material 106C and the first conductive layer 106A are different. The conductive material 106C may be formed by any suitable method, such as CVD, PVD, or the like. In some embodiments, the conductive material 106C has a thickness of about 20 nm to about 30 nm.

Furthermore, as illustrated in FIG. 3, a metallic material 108 is conformally formed on the conductive material 106C. For example, the metallic material 108 is electrically connected to and in physical contact with the conductive material 106C. The metallic material 108 include metal materials, such as Ti, Co, Cu, AlCu, W, TiN, TiW, TiAl, TiAlN, TaN, Pt, or a combination thereof. The metallic material 108 may be formed by any suitable method, such as CVD, PVD, or the like. In some embodiments, the metallic material 108 has a thickness of about 30 nm to about 50 nm. In one embodiment, the material of the metallic material 108 is different from the material of the conductive material 106C and/or the material of the first conductive layer 106A. For example, when the conductive material 106C and the first conductive layer 106A are both TiN, the metallic material 108 includes W. As shown in FIG. 3, at this stage, the dielectric layer 102 and the first conductive layer 106A are covered by the storage element material 106B, the conductive material 106C and the metallic material 108.

Figure 4:
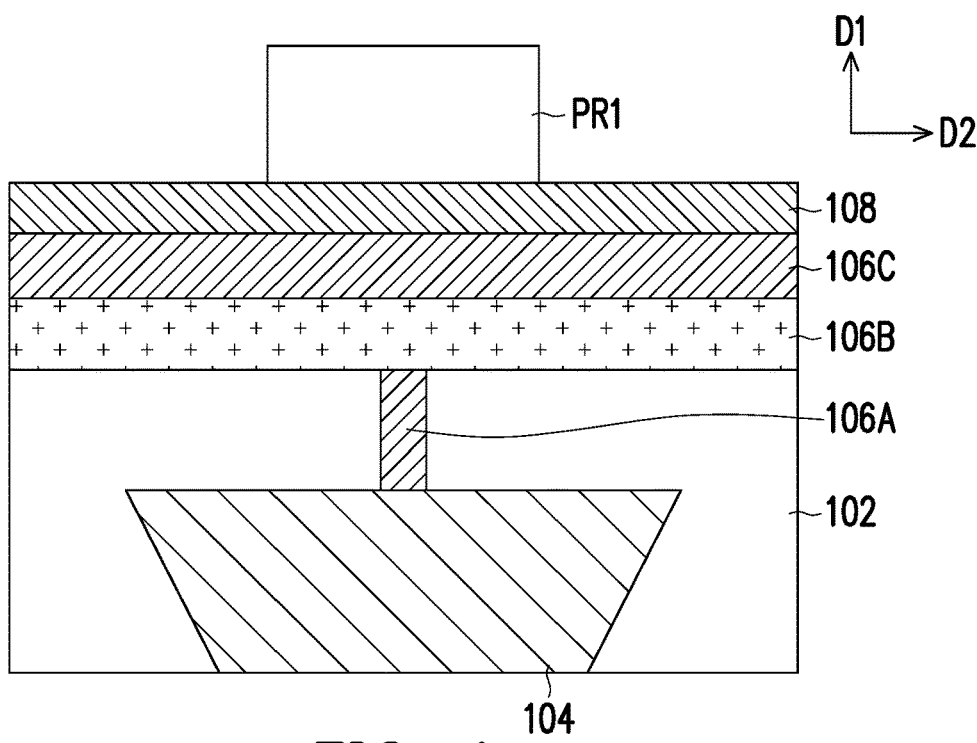

Referring to FIG. 4, in some embodiments, a photoresist pattern PR1 is formed on the metallic material 108. The photoresist pattern PR1 may be located in an area corresponding to a center position of the bottom electrode 104. In other words, the photoresist pattern PR1 is stacked up over the bottom electrode 104 in the first direction D1. The photoresist pattern PR1 may have a round, square, or rectangular profile in the top view depending on a desired shape of the later-formed memory element. In one embodiment, the photoresist pattern PR1 may be formed by coating (such as spin-coating) and photolithography processes or the like; however, the disclosure is not limited thereto. A material of the photoresist pattern PR1, for example, includes a positive resist material or a negative resist material, that is suitable for a patterning process such as a photolithography process with a mask or a mask-less photolithography process (for instance, an electron-beam (e-beam) writing or an ion-beam writing). In the disclosure, the photoresist pattern PR1 is referred to as a photoresist layer or a resist layer. As shown in FIG. 4, for example, along the first direction D1 and the second direction D2, a size of the photoresist pattern PR1 is smaller than a size of the bottom electrode 104.

Referring to FIG. 5, in a subsequent step, by using the photoresist pattern PR1 as a mask, the metallic material 108, the conductive material 106C, the storage element material 108B are patterned to form a metal mask layer 108', a second conductive layer 106C' and a storage layer 106B'. In some embodiments, the first conductive layer 106A, the storage layer 106B', the second conductive layer 106C' together constitute a memory element 106. For example, as illustrated in FIG. 5, the memory element 106 is a metal-insulator-metal (MIM) structure and is referred to as an RRAM (resistive random access memory) device. In some embodiments, the first conductive layer 106A is referred to as a bottom electrode of the RRAM and the second conductive layer 106C' is referred to as a top electrode of the RRAM.

Generally, a RRAM device or element (e.g., the memory element 106) operates under the principle that a dielectric material/layer, which is normally insulating, can be made to conduct through a filament or conduction path formed after the application of a sufficiently high voltage. The conduction path formation can arise from different mechanisms, including but not limited to defect, metal migration, oxygen vacancy, etc. As described above, during a write operation to the memory element 106, a 'set' voltage is applied across the top and bottom electrodes to change the variable resistance dielectric material from a first resistivity (e.g., a high resistance state (HRS), where a filament or conduction path between the top and bottom electrodes are broken) to a second resistivity (e.g., a low resistance state (LRS), where the filament or conduction path between the top and bottom electrodes are established).

Similarly, a 'reset' voltage is applied across the top and bottom electrodes to change the variable resistance dielectric material from the second resistivity back to the first resistivity, for example, from LRS to HRS. Therefore, in instances where the LRS and HRS correspond to logic "1" and logic "0" states (or vice versa), respectively; the 'set' and 'reset' voltages can be used to store digital information bits in the RRAM cell (e.g. memory cell MC1 in FIG. 8) through the memory element 106 to provide relevant memory functions.

In the exemplary embodiment, the metal mask layer 108', the second conductive layer 106C' and the storage layer 106B' may be formed on the dielectric layer 102 and the first conductive layer 106A by, but not limited to, patterning the metallic material 108 using the photoresist pattern PR1 as the mask to form the metal mask layer 108'; patterning the conductive material 106C using the photoresist pattern PR1 (and the metal mask layer 108') as the mask to form the second conductive layer 106C'; patterning the storage element material 106B using the photoresist pattern PR1 (the metal mask layer 108' and the second conductive layer 106C') as the mask to form the storage layer 108, thereby forming the memory element 106. The above patterning processes, for example, independently include an etching step, such as a dry etching, a wet etching or a combination thereof.

In some embodiments, the photoresist pattern PR1 is removed after the formation of the memory element 106 by acceptable ashing process and/or photoresist stripping process, such as using an oxygen plasma or the like. The disclosure is not limited thereto. For example, due to the use of the photoresist pattern PR1, the geometry of the metal mask layer 108' is identical to the geometry of the storage layer 106B' and the second conductive layer 106C' in the sectional view depicted in FIG. 5. That is, sidewalls 108-SW of the metal mask layer 108' are aligned with sidewalls 106B-SW of the storage layer 106B' and sidewalls 106C-SW of the second conductive layer 106C'.

As further illustrated in FIG. 5, in some embodiments, the storage layer 106B' is located in between the first conductive layer 106A and the second conductive layer 106C', and the second conductive layer 106C' is located in between the storage layer 106B' and the metal mask layer 108'. In some embodiments, the width W1 of the first conductive layer 106A is smaller than a width W2 of the second conductive layer 106C'. In certain embodiments, the width W2 of the second conductive layer 106C' is substantially equal to the widths of the storage layer 106B' and metal mask layer 108'. Furthermore, the width W2 of the second conductive layer 106C' is smaller than a minimum width 104W of the bottom electrode 104. In some embodiments, lateral dimensions LDx of the metal mask layer 108', the storage layer 106B', and the second conductive layer 106C', and a lateral dimension (W1) of the first conductive layer 106A are smaller than the lateral dimension LDy of the bottom electrode 104. In other words, the memory element 106 and the metal mask layer 108' are located over the bottom electrode 104 within an area (e.g. top surface area) of the bottom electrode 104. In some embodiments, a ratio (W2:LDy) of the width W2 of the second conductive layer 106C' to the lateral dimension LDy of the bottom electrode 104 is around 1:3 to 1:10. By keeping the ratio (W2:LDy) in such a range, higher electrical current delivery (for memory operation) may be ensured.

Figure 6:
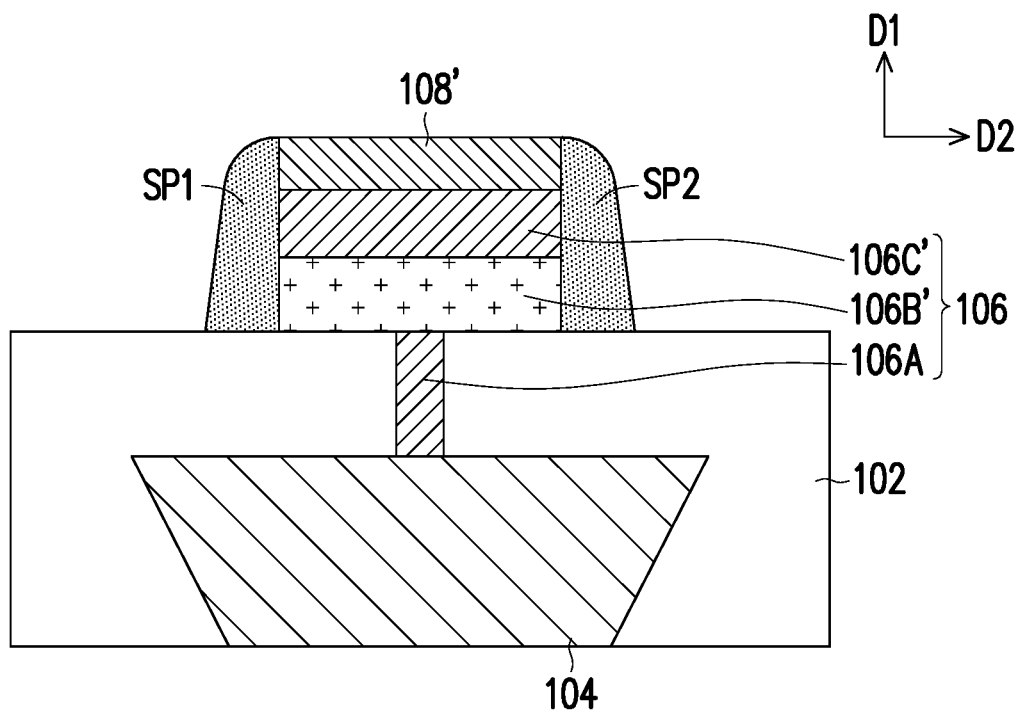

Referring to FIG. 6, in some embodiments, after the formation of the memory element 106 and the metal mask layer 108', spacers (SP1 and SP2) are formed on the dielectric layer 102 aside the metal mask layer 108', the second conductive layer 106C' and the storage layer 106B'. For example, a first spacer SP1 and a second spacer SP2 are disposed on two opposing sides of the memory element 106 and covering the sidewalls 108-SW of the metal mask layer 108', sidewalls 106B-SW of the storage layer 106B' and sidewalls 106C-SW of the second conductive layer 106C'. In certain embodiments, the first spacer SP1 and the second spacer SP2 are physically separated from the first conductive layer 106A. In some embodiments, the spacers (SP1 and SP2) extends laterally along sidewalls of the metal mask layer 108', the storage layer 106B' and the second conductive layer 106C in a closed path to enclose these elements.

In some embodiments, the first spacer SP1 and the second spacer SP2 are formed by depositing a spacer layer (not shown) over and around the metal mask layer 108', the storage layer 106B' and the second conductive layer 106C. For example, the spacer layer is deposited by a deposition technique (e.g., PVD, CVD, PECVD (plasma-enhanced chemical vapor deposition), ALD, sputtering, etc.) to a desired thickness. Thereafter, the spacer layer is etched to remove the spacer layer from horizontal surfaces (e.g. along the second direction D2), leaving spacers (SP1 and SP2) along opposing sides of the memory element 106. In various embodiments, the spacers (SP1 and SP2) may comprise a nitride (e.g., silicon nitride or silicon oxy-nitride), an oxide (e.g., silicon dioxide), or the like.

Figure 7:
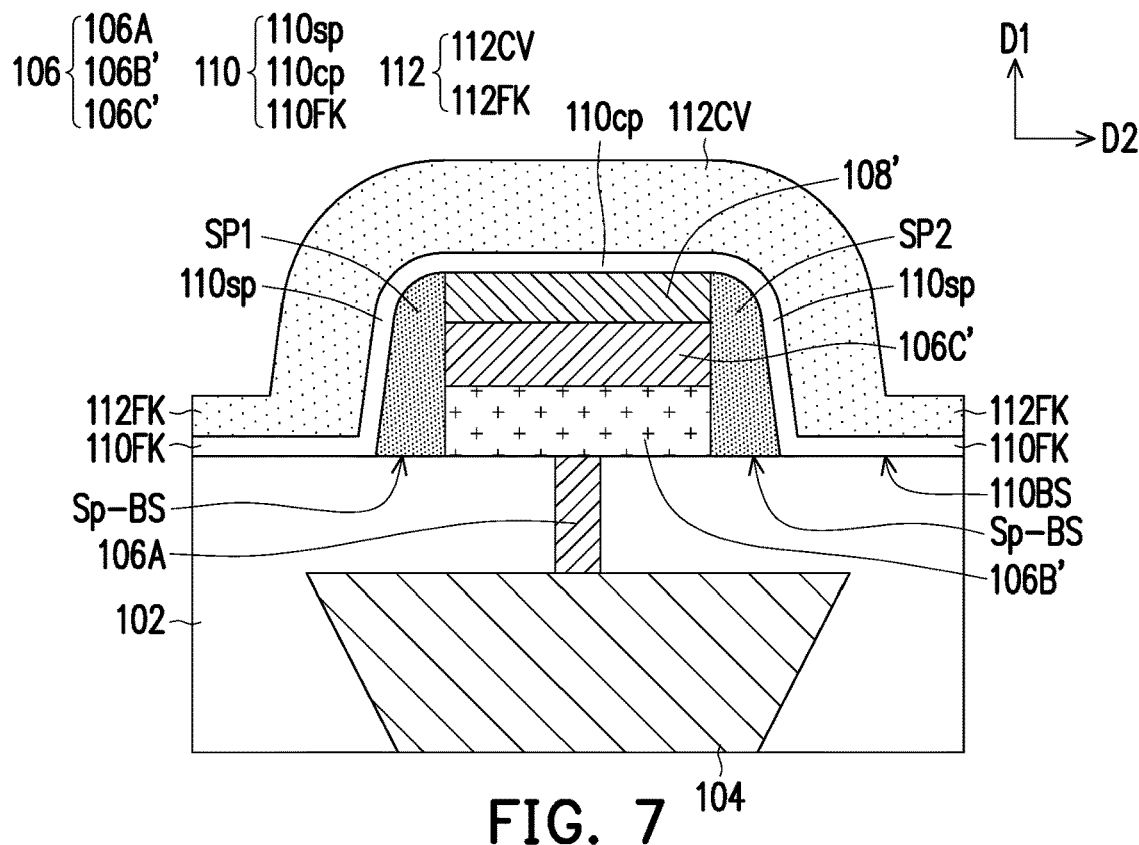

Referring to FIG. 7, in a subsequent step, a selector 110 and a top electrode 112 are sequentially formed over the dielectric layer 102, the spacers (SP1 and SP2), the memory element 106 and the metal mask layer 108'. In some embodiments, the selector 110 is conformally formed over the dielectric layer 102, the spacers (SP1 and SP2) and over the memory element 106. Furthermore, the top electrode 112 is conformally formed over the selector 110. For example, the selector 110 is located in between the spacers (SP1 and SP2), the metal mask layer 108' and the top electrode 112, and the selector 110 is physically separated from the storage layer 106B' by the spacers (SP1 and SP2). The selector and the top electrode 112 may be formed over the memory element 106 along the first direction D1.

As illustrated in FIG. 7, the selector 110 comprises a cap portion 110cp, side portions 110sp and flank portions 110FK. For example, the cap portion 110cp is covering a top surface of the memory element 106. In certain embodiments, the cap portion 110cp is covering and in physical contact with a top surface of the metal mask layer 108'. In some embodiments, the side portions 110sp are located on two sides of the cap portion 110cp, and are covering the sidewalls of the memory element 106. In certain embodiments, the side portions 110sp are covering and in physical contact with the spacers (SP1 and SP2). In some embodiments, the flank portions 110FK are joined with the side portions 110sp and are located on the dielectric layer 102. In certain embodiments, the flank portions 110FK are in physical contact with the dielectric layer 102, wherein bottom surfaces 110BS of the flank portions 110FK are aligned with bottom surfaces Sp-BS of the first and second spacers SP1 and SP2. As further illustrated in FIG. 7, the top electrode 112 formed on the selector 110 has a cover portion 112CV and flank portions 112FK joined with the cover portion 112CV. For example, the cover portion 112CV is in physical contact with the cap portion 110cp, the side portions 110sp and the flank portions 110FK of the selector 110. Furthermore, the flank portions 112FK of the top electrode 112 are located on the flank portions 110FK of the selector 110.

In some embodiments, the selector 110 comprises an ovonic threshold switch (OTS) material. The OTS material is responsive to an applied voltage across the selector 110. For an applied voltage that is less than a threshold voltage, the selector 110 remains in an "off" state, e.g., an electrically nonconductive state. Alternatively, responsive to an applied voltage across the selector 110 that is greater than the threshold voltage, the selector 110 enters an "on" state, e.g., an electrically conductive state. That is, the selector 110 is referred to as a switch for determining to turn on or turn off the memory element 106.

In some embodiments, the OTS material of the selector 110 may include GeTe, AsGeSe, GeSbTe, GeSiAsTe, GeSe, GeSbSe, GeSiAsSe, GeS, GeSbS, GeSiAsS, or combinations thereof. Alternatively, the OTS material of the selector 110 may include BTe, CTe, BCTe, CSiTe, BSiTe, BCSiTe, BTeN, CTeN, BCTeN, CSiTeN, BSiTeN, BCSiTeN, BTeO, CTeO, BCTeO, CSiTeO, BSiTeO, BCSiTeO, BTeON, CTeON, BCTeON, CSiTeON, BSiTeON, BCSiTeON, or combinations thereof. The selector 110 may be formed by any suitable method, such as PVD, ALD, or the like. In some embodiments, the selector has a thickness of about 10 nm to 30 nm.

In some embodiments, the top electrode 112 include conductive materials, such as Ti, Co, Cu, AlCu, W, TiN, TiW, TiAl, TiAlN, TaN, Pt, the like, or a combination thereof. The top electrode 112 may be formed by any suitable method, such as CVD, PVD, or the like. In some embodiments, the top electrode 112 has a thickness of about 50 nm to about 100 nm. In one embodiment, the material of the top electrode 112 is the same as the material of the metal mask layer 108'. For example, the top electrode 112 includes W. However, the disclosure is not limited thereto, and the material of the top electrode 112 may be adjusted based on design requirements. In alternative embodiments, the material of the top electrode 112 may be the same as or different from the materials of the first conductive layer 106A and the second conductive layer 106C'.

Figure 8:
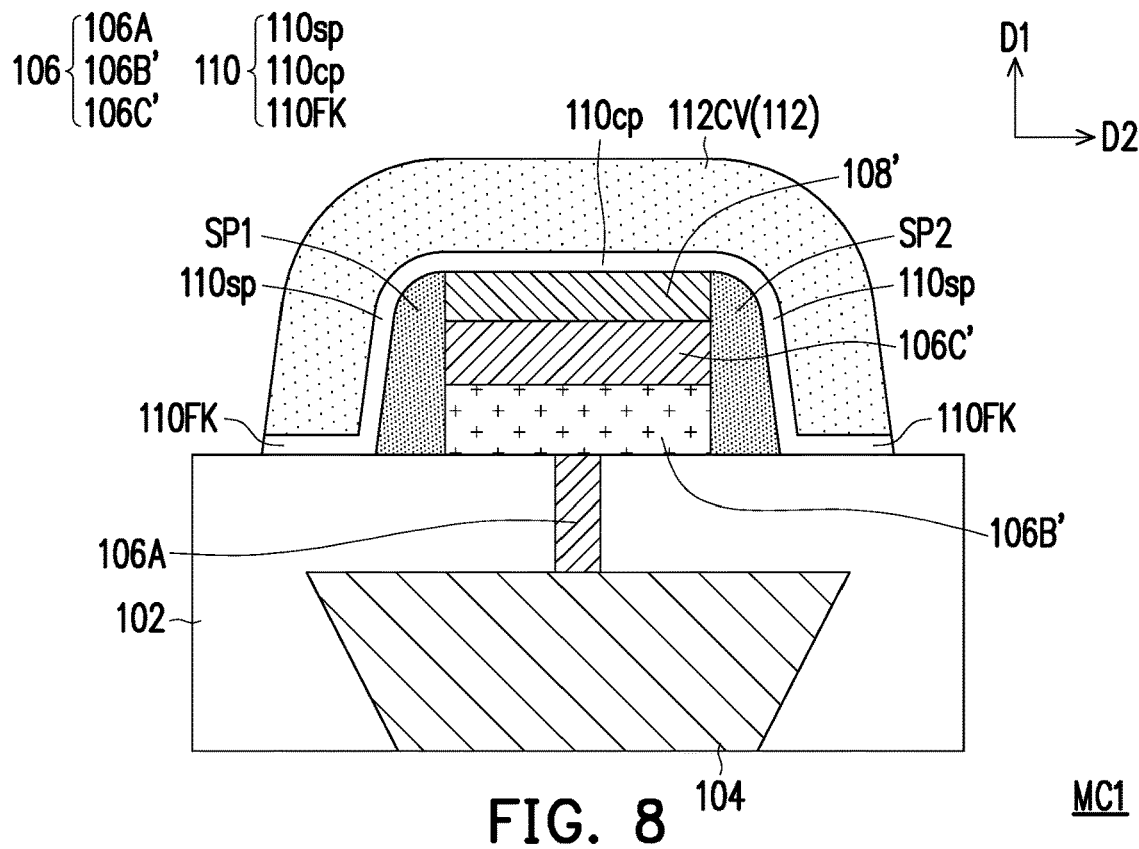

Referring to FIG. 8, in a subsequent step, a patterning process is performed to partially remove the flank portions 110FK of the selector 110, and partially remove the top electrode 112 located on the flank portions 110FK. In some embodiments, the flank portions 112FK of the top electrode 112 are completely removed, and the cover portion 112CV of the top electrode 112 is retained. In certain embodiments, the patterning process is performed so that the sides of the cover portion 112CV of the top electrode 112 are aligned with the sides of the flank portions 110FK of the selector 110. The patterning process, for example, includes an etching step, such as a dry etching, a wet etching or a combination thereof. In some embodiments, the top electrode 112 is formed with a reversed U-shape covering the selector 110 after the patterning process. Up to here, a memory cell MC1 according to some embodiments of the present disclosure is accomplished. In the memory cell MC1 the selector 110 is electrically coupled to the memory element 106.

As illustrated in FIG. 8, the second conductive layer 106C' of the memory element 106 is electrically connected to the selector 110 through the metal mask layer 108'. That is, the memory element 106 is electrically coupled to the selector 110 in series. With such configuration, the voltage may be applied to the selector 106 for controlling the status (e.g. "on" or "off") of the memory element 106. While the memory element 106 is turned on, the voltages are further applied to the first conductive layer 106A and the second conductive layer 106C' of the memory element 106 for operating the memory functions thereof (via HRS and LRS). As illustrated in FIG. 8, the memory cell MC1 has one selector 110 and one memory element 106 electrically connected to each other and located between the overlying interconnection structures and underlying interconnection structures (not shown). In other words, the memory cell MC1 is implemented as a 1-selector-1-resistor (1S1R) configuration. However, the disclosure is not limited thereto, and in other embodiments, the memory cell may include one selector 110 and a plurality of memory elements electrically connected to the selector 110. In some other embodiments, the memory cell MC1 is implemented as a 1-selector-1-transitor-1-resistor (1S1T1R) configuration.

In the exemplary embodiment, the dimensions of the memory element 106 are scaled down, and a small contact area is provided between the first and second conductive layers 106A, 106C', which is in favor of high electrical current delivery performance for memory operation, and to achieve high pattern density. By designing the memory element 106 in such a small scale, the selector 110 may be formed over and around the memory element 106 in the same film layer through a self-aligned process. As such, high density memory cells MC1 with high operation current may be achieved, while the manufacturing process steps may be reduced.

Figure 9:
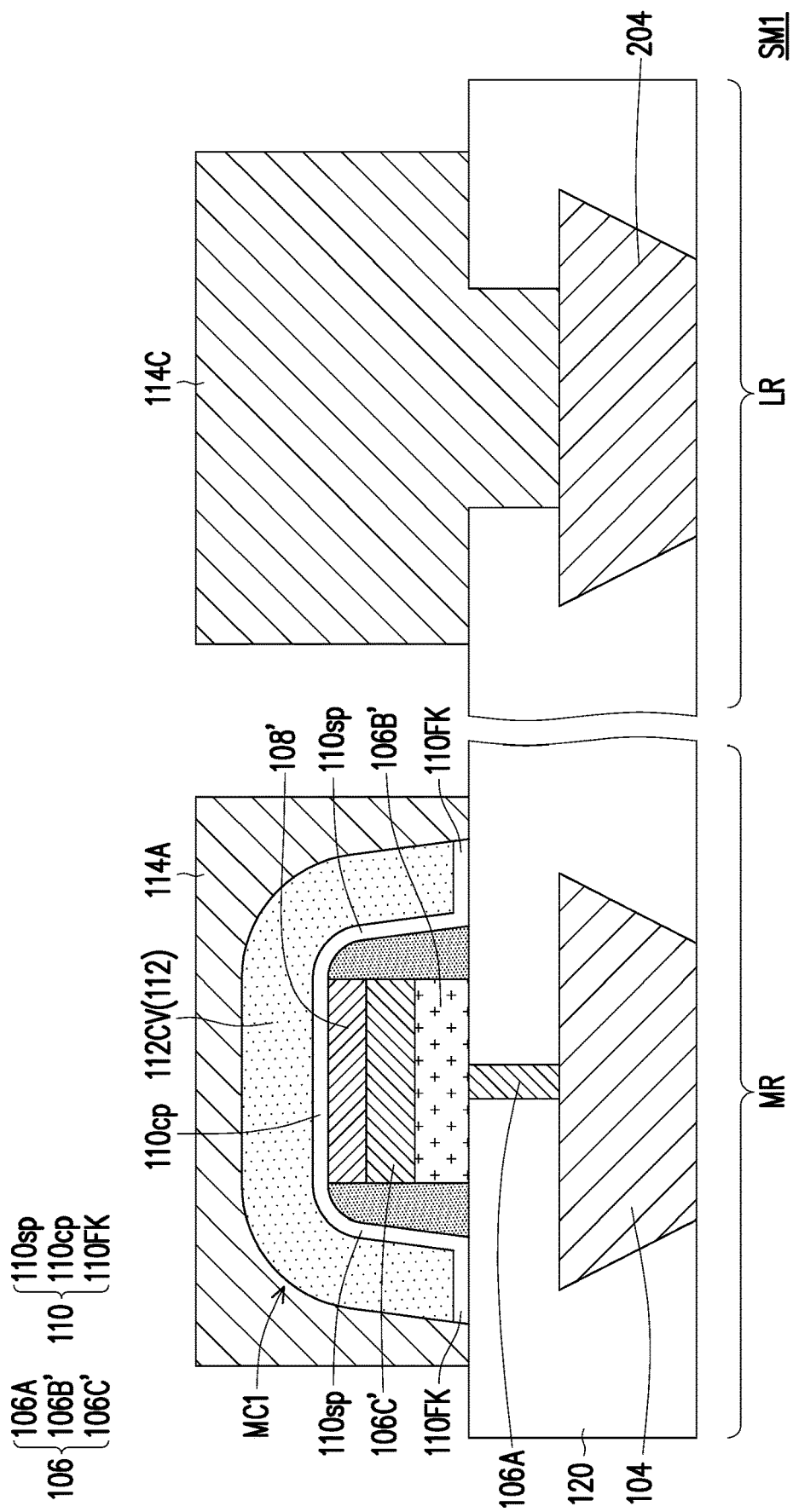
FIG. 9 is a schematic sectional view of a semiconductor device in accordance with some other embodiments of the present disclosure.

FIG. 9 is a schematic sectional view of a semiconductor device in accordance with some other embodiments of the present disclosure. As illustrated in FIG. 9, the semiconductor device SM1 includes a memory region MR and a logic region LR. In some embodiments, the memory region MR includes the memory cell MC1 as illustrated in FIG. 8. Therefore, the method of forming the memory cell MC1 may be referred to the steps shown in FIG. 1 to FIG. 8 and its detailed description will be omitted herein. In some embodiments, a connection layer 114A (part of an interconnection layer) is further disposed on the memory cell MC1 in the memory region MR. For example, the connection layer 114A is electrically connected to the top electrode 112 of the memory cell MC1. The connection layer 114A may provide a voltage to the selector 110 for controlling the status of the memory cell MC1 (e.g. turning "on" or "off" the memory element 106).

In some embodiments, the logic region LR may include logic devices (not shown). For example, the logic devices include, for example, an insulated gate field effect transistor (IGFET), a metal oxide semiconductor field effect transistor (MOSFET), or some other type of semiconductor device. In some embodiments, the dielectric layer 102 in the memory region MR also extend towards the logic region LR. In other words, the dielectric layer 102 is shared between the memory region MR and the logic region LR. In certain embodiments, an electrode layer 204 is embedded in the dielectric layer 102 in the logic region LR. For example, the electrode layer 204 may be electrically coupled to the logic devices. In some embodiments, the logic devices support operation of the memory cell MC1. For example, the logic devices may facilitate reading and/or writing data of to the memory cell MC1. In some embodiments, the logic region LR further includes a connection layer 114C. For example, the connection layer 114C of the logic region LR is located at the same level with the connection layer 114A of the memory region LR. In certain embodiments, the connection layer 114A, the connection layer 114C and the storage layer 106B' are located on the same surface of the dielectric layer 102.

Figure 10:
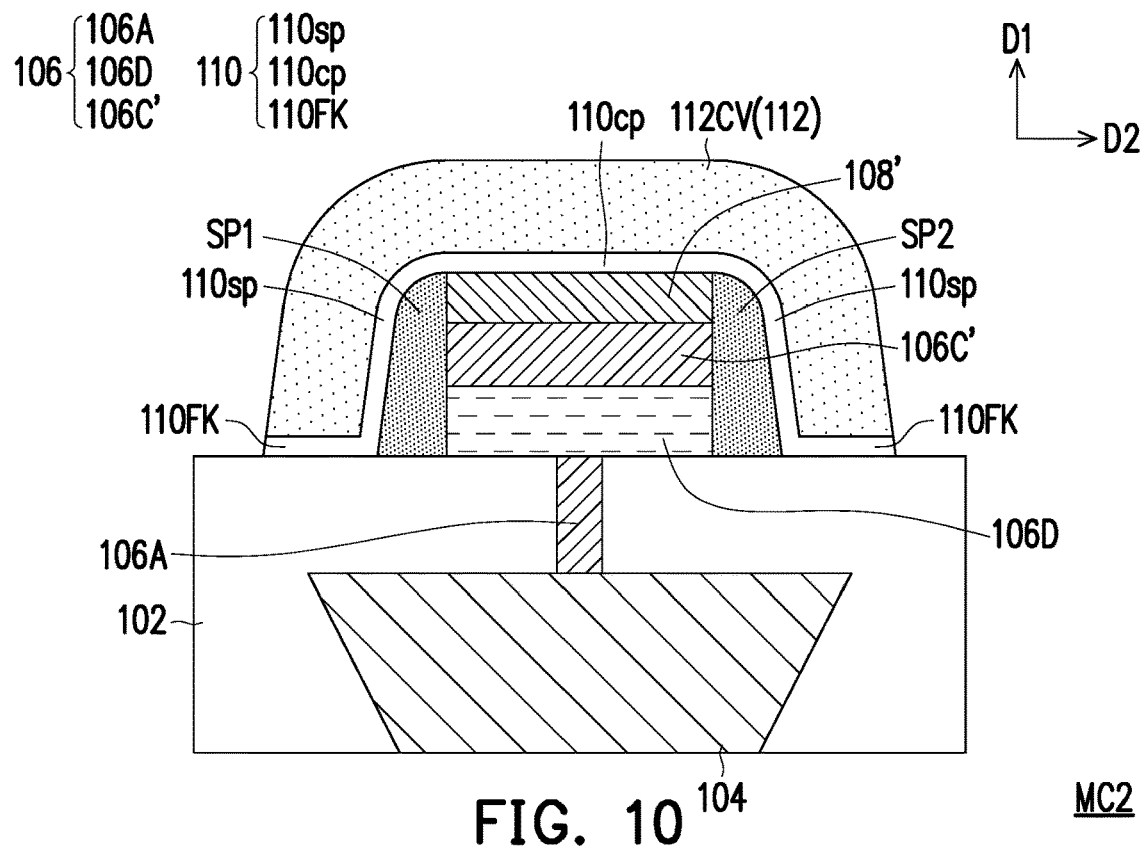
FIG. 10 is a schematic sectional view of a memory cell in accordance with some other embodiments of the present disclosure.

FIG. 10 is a schematic sectional view of a memory cell in accordance with some other embodiments of the present disclosure. The memory cell MC2 illustrated in FIG. 10 is similar to the memory cell MC1 illustrated in FIG. 8. Therefore, the same reference numerals are used to refer to the same or liked parts, and its detailed description will be omitted herein. In the previous embodiments, the memory element 106 is directed to RRAM devices. However, the disclosure is not limited thereto, and the memory element may be applied to a phase change random access memory (PCRAM) element. For example, referring to FIG. 10, the memory cell MC1 includes a storage layer 106D located in between the first conductive layer 10A and the second conductive layer 106C', whereby the storage layer 106D include a phase change material.

In some embodiments, the phase change material of the storage layer 106D includes a chalcogenide material, such as an indium (In)-antimony (Sb)-tellurium (Te) (IST) material or a germanium (Ge)-antimony (Sb)-tellurium (Te) (GST) material. The ISG material may include $In_2Sb_2Te_5$, $In_1Sb_2Te_4$, $In_1Sb_4Te_7$, or the like. The GST material may include $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. Other phase change materials may include Ge—Te, In—Se, Sb—Te, Ga—Sb, In—Sb, As—Te, Al—Te, Ge Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd Te—Ge—Sn, In—Se—Ti—Co, Ge—Sb—Te—Pd, Ge—Sb—Te—Co, Sb—Te—Bi—Se, Ag—In—Sb—Te, GeSb—Se—Te, Ge—SnSb—Te, GeTe—Sn—Ni, GeTe—Sn Pd, and Ge—Te—Sn—Pt, for example. The formation of the storage layer 106D may be similar to that of the storage layer 106B' illustrated in FIG. 8, and may have substantially the same thickness.

Due to the storage layer 106D being inclusive of the phase change material, the storage layer 106D has a variable phase representing a data bit. For example, the storage layer 106D has a crystalline phase and an amorphous phase which are interchangeable. The crystalline phase and the amorphous phase may respectively represent a binary "1" and a binary "0", or vice versa. Accordingly, the storage layer 106D has a variable resistance that changes with the variable phase of the storage layer 106D. For example, the storage layer 106D has a high resistance in the amorphous phase and a low resistance in the crystalline phase.

In the operation of the memory cell MC2, the data state of the memory cell MC2 is read by measuring the resistance of the memory cell MC2 (i.e., the resistance from the first conductive layer 106A (e.g. serving as the bottom electrode) to the second conductive layer 106C' (e.g. serving as the top electrode)). The phase of the storage layer 106D represents the data state of the memory cell MC2, the resistance of the storage layer 106D, or the resistance of the memory cell MC2. Furthermore, the data state of the memory cell MC2 may be set and reset by changing the phase of the storage layer 106D.

In some embodiments, the phase of the storage layer 106D is changed by heating. For example, the first conductive layer 106A (or second conductive layer 106C') heats the storage layer 106D to a first temperature that induces crystallization of the storage layer 106D, so as to change the storage layer 106D to the crystalline phase (e.g., to set the memory cell MC2). Similarly, the first conductive layer 106A (or second conductive layer 106C') heats the storage layer 106D to a second temperature that melts the storage layer 106D, so as to change the storage layer 106D to the amorphous phase (e.g., to reset the memory cell MC2). The first temperature is lower than the second temperature. In some embodiments, the first temperature is 100° C. to 200° C. and the second temperature is 500° C. to 800° C. In the disclosure, for the memory cell MC2, the first conductive layer 106A may be referred to as a heater, or the first conductive layer 106A and the second conductive layer 106C' may be together referred to as the heater.

The amount of heat generated by the first conductive layer 106A (or second conductive layer 106C') varies in proportion to the current applied to the first conductive layer 106A (or second conductive layer 106C'). That is, the storage layer 106D is heated up to a temperature (i.e., the second temperature) higher than the melting temperature when current passes through it. The temperature is then quickly dropped below the crystallization temperature. In the case, a portion of the storage layer 106D is changed to the amorphous state with high resistivity, and thus the state of the memory cell MC2 is changed to a high resistance state. Then, the portion of the storage layer 106D may be reset back to the crystalline state by heating up the storage layer 106D to a temperature (i.e., the first temperature) higher than the crystallization temperature and lower than the melting temperature, for a certain period.

In the exemplary embodiment, the dimensions of the memory element 106 are scaled down, and a small contact area is provided between the first and second conductive layers 106A, 106C', which is in favor of high electrical current delivery performance for memory operation, and to achieve high pattern density. By designing the memory element 106 in such a small scale, the selector 110 may be formed over and around the memory element 106 in the same film layer through a self-aligned process. As such, high density memory cells MC2 with high operation current may be achieved, while the manufacturing process steps may be reduced.

Figure 11:
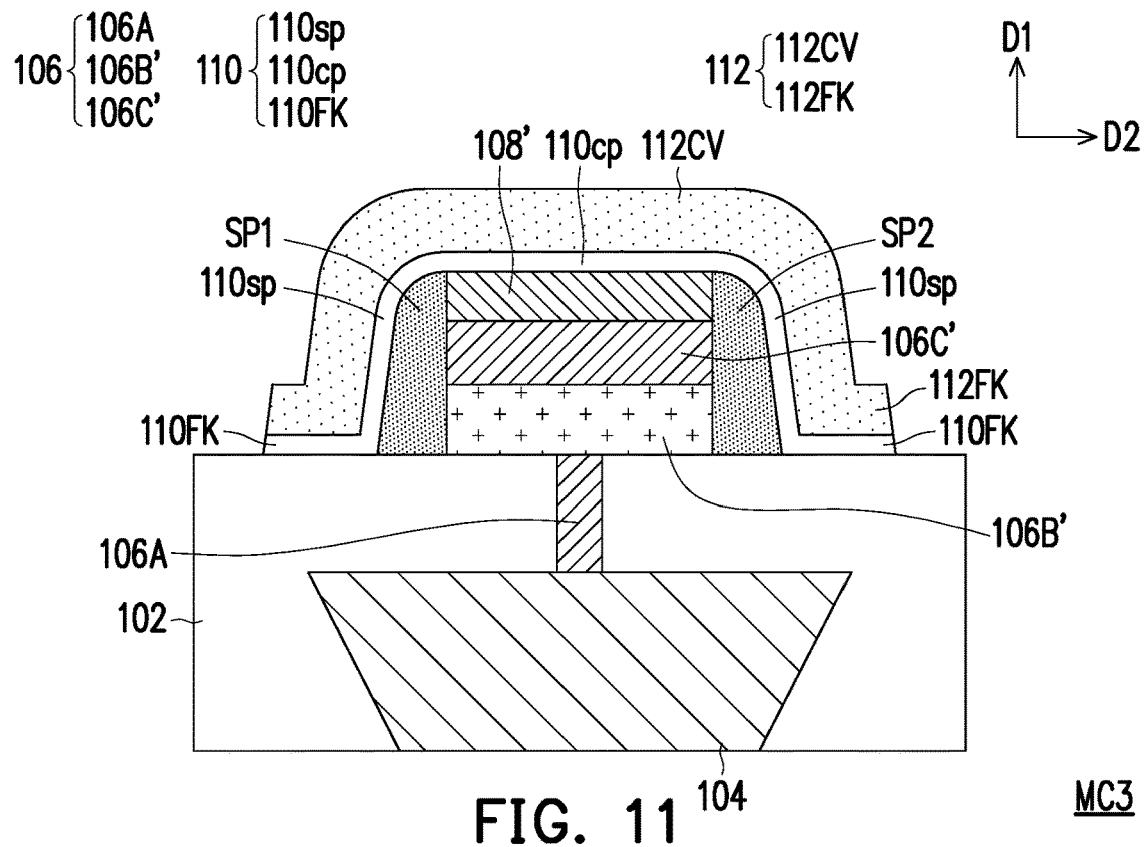
FIG. 11 is a schematic sectional view of a memory cell in accordance with some other embodiments of the present disclosure.

FIG. 11 is a schematic sectional view of a memory cell in accordance with some other embodiments of the present disclosure. The memory cell MC3 illustrated in FIG. 11 is similar to the memory cell MC1 illustrated in FIG. 8. Therefore, the same reference numerals are used to refer to the same or liked parts, and its detailed description will be omitted herein. The difference between the embodiments is in the design of the top electrode 112. In the previous embodiment, during a patterning process (described in FIGS. 7-8), the flank portions 112FK of the top electrode 112 are completely removed, and the cover portion 112CV of the top electrode 112 is retained. However, the disclosure is not limited thereto. Referring to FIG. 11, in some embodiments, the patterning process partially removes the flank portions 112FK of the top electrode 112. In other words, in the memory cell MC3, the top electrode 112 includes a cover portion 112CV and flank portions 112FK joined with the cover portion 112CV.

In the exemplary embodiment, the dimensions of the memory element 106 are scaled down, and a small contact area is provided between the first and second conductive layers 106A, 106C', which is in favor of high electrical current delivery performance for memory operation, and to achieve high pattern density. By designing the memory element 106 in such a small scale, the selector 110 may be formed over and around the memory element 106 in the same film layer through a self-aligned process. As such, high density memory cells MC3 with high operation current may be achieved, while the manufacturing process steps may be reduced.

Figure 12:
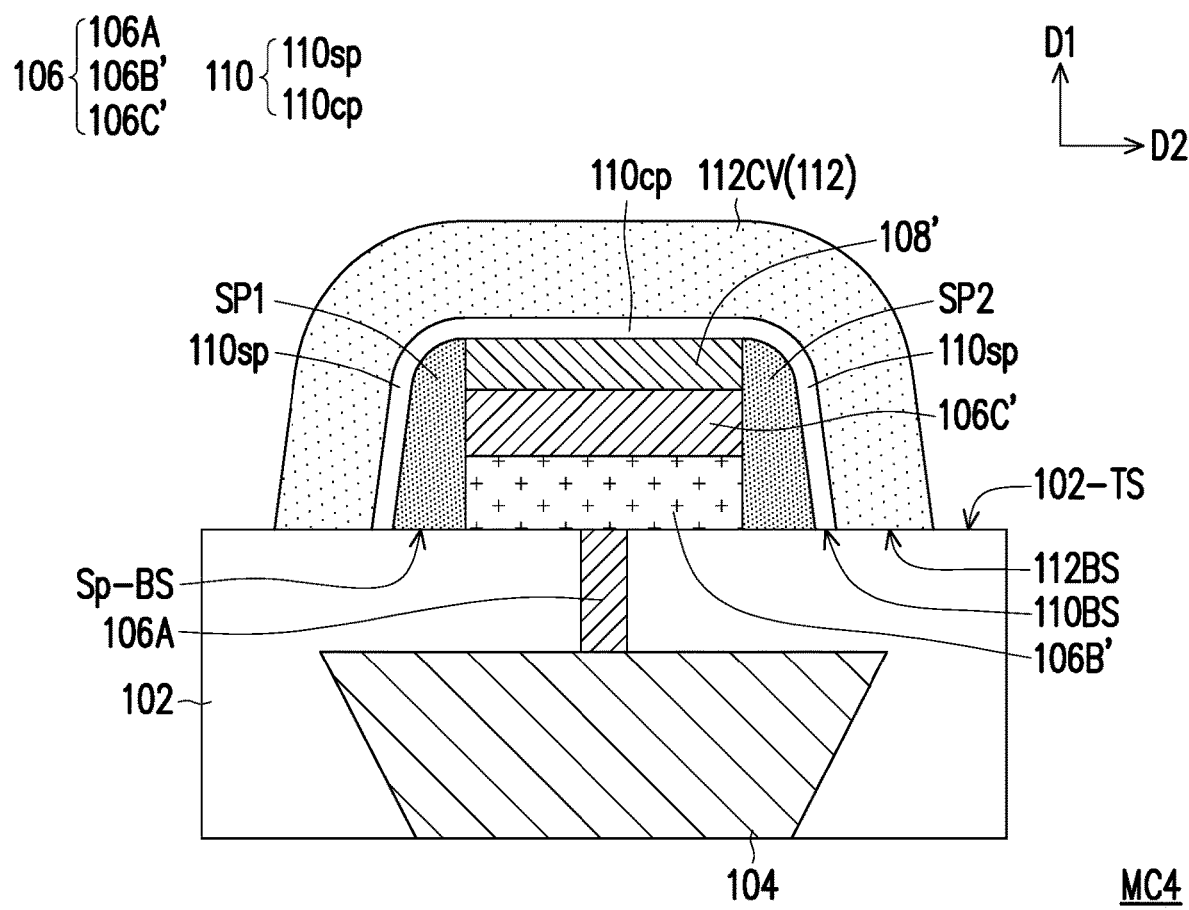
FIG. 12 is a schematic sectional view of a memory cell in accordance with some other embodiments of the present disclosure.

FIG. 12 is a schematic sectional view of a memory cell in accordance with some other embodiments of the present disclosure. The memory cell MC4 illustrated in FIG. 12 is similar to the memory cell MC1 illustrated in FIG. 8. Therefore, the same reference numerals are used to refer to the same or liked parts, and its detailed description will be omitted herein. The difference between the embodiments is in the design of selector 110 and the top electrode 112. In the previous embodiment, the selector 110 is formed to include flank portions 110FK. However, the disclosure is not limited thereto. For example, referring to FIG. 12, the selector 110 includes a cap portion 110cp and side portions 110sp joined with the cap portion 110cp. In other words, the flank portions 110FK are omitted from the selector 110. In some embodiments, the top electrode 112 is conformally formed on the selector 110 and includes a cover portion 112CV. For example, the cover portion 112CV of the top electrode 112 is covering and in physical contact with the cap portion 110cp and the side portions 110sp of the selector 110. Furthermore, bottom surfaces 110BS of the selector 110 are aligned with a bottom surface 112BS of the top electrode 112, and aligned with bottom surfaces Sp-BS of the first and second spacers SP1 and SP2. In some embodiments, both the selector 110 and top electrode 112 are formed with a reversed U-shape, whereby the selector 110 covers and surround the spacers (SP1 and SP2) and the memory element 106, while the top electrode 112 covers and surround the selector 110.

In the exemplary embodiment, the dimensions of the memory element 106 are scaled down, and a small contact area is provided between the first and second conductive layers 106A, 106C', which is in favor of high electrical current delivery performance for memory operation, and to achieve high pattern density. By designing the memory element 106 in such a small scale, the selector 110 may be formed over and around the memory element 106 in the same film layer through a self-aligned process. As such, high density memory cells MC4 with high operation current may be achieved, while the manufacturing process steps may be reduced.

Figure 13:
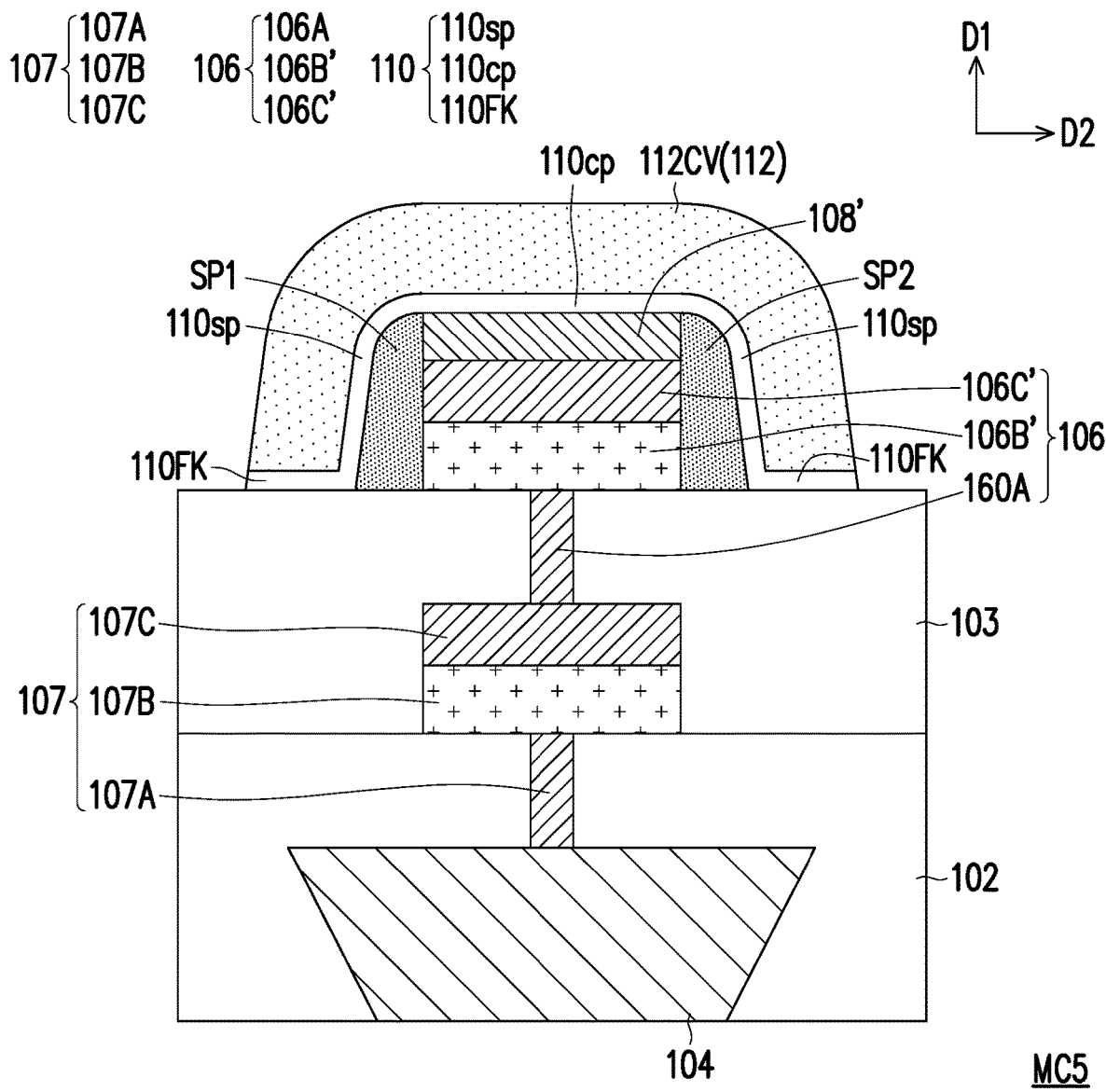
FIG. 13 is a schematic sectional view of a memory cell in accordance with some other embodiments of the present disclosure.

FIG. 13 is a schematic sectional view of a memory cell in accordance with some other embodiments of the present disclosure. The memory cell MC5 illustrated in FIG. 13 is similar to the memory cell MC1 illustrated in FIG. 8. Therefore, the same reference numerals are used to refer to the same or liked parts, and its detailed description will be omitted herein. The difference between the embodiments is that a second memory element 107 is further included in the memory cell MC5. In the previous embodiment, a 1-selector-1-resistor (1S1R) configuration is implemented in the memory cell MC1. However, the disclosure is not limited thereto. For example, referring to FIG. 13 a 1-selector-2-resistor (1S2R) configuration is implemented in the memory cell MC4. In other words, it is appreciated that the memory cell of the disclosure may be implemented with any one of a 1S1R configuration, a 1S2R configuration, a 1S3M configuration, a 1S4M configuration . . . , a 1SxR configuration, etc. It is noted that x is a positive integer.

In some embodiments, in the memory cell MC5 which has the 1S2R configuration, the memory cell MC5 includes one selector 110 and two memory elements 106 and 107. The selector 110 and the memory element 106 is similar to that described in FIG. 8, hence its detailed description will not be repeated herein. As illustrated in FIG. 13, the memory cell MC5 further includes a second memory element 107 disposed in between the memory element 106 and the bottom electrode 104. In other words, the memory element 106 is electrically connected to the bottom electrode 104 through the second memory element 107. The second memory element 107 may include a first conductive layer 107A, a storage layer 107B and a second conductive layer 107C. The first conductive layer 107A is electrically and physically connected to the bottom electrode 104, and the first conductive layer 107A is embedded within the dielectric layer 102. The storage layer 107B is disposed on the first conductive layer 107A, and located in between the first conductive layer 107A and the second conductive layer 107C. The second conductive layer 107C is disposed on and in physical contact with the storage layer 107B. The formation methods and materials of the memory element 107 are the same as or similar to the formation methods and materials of the memory element 106 described previously, and thus are not repeated herein.

In some embodiments, the memory cell MC5 further includes a dielectric layer 103 disposed on the dielectric layer 102. In one embodiment, the dielectric layer 103 may be made by similar methods and made of similar materials as the dielectric layer 102. In certain embodiments, the dielectric layer 103 is covering the storage layer 107B and the second conductive layer 107C of the memory element 107, and is further covering the first conductive layer 106A of the memory element 106. Furthermore, the selector 110, the memory element 106 and the memory element 107 are electrically coupled to each other in series.

In the exemplary embodiment, the dimensions of the memory elements 106 and 107 are scaled down, and a small contact area is provided between the first and second conductive layers 106A, 106C', 107A and 107C, which is in favor of high electrical current delivery performance for memory operation, and to achieve high pattern density. By designing the memory elements 106 and 107 in such a small scale, the selector 110 may be formed over and around the memory element 106 in the same film layer through a self-aligned process. As such, high density memory cells MC5 with high operation current may be achieved, while the manufacturing process steps may be reduced.

Figure 14:
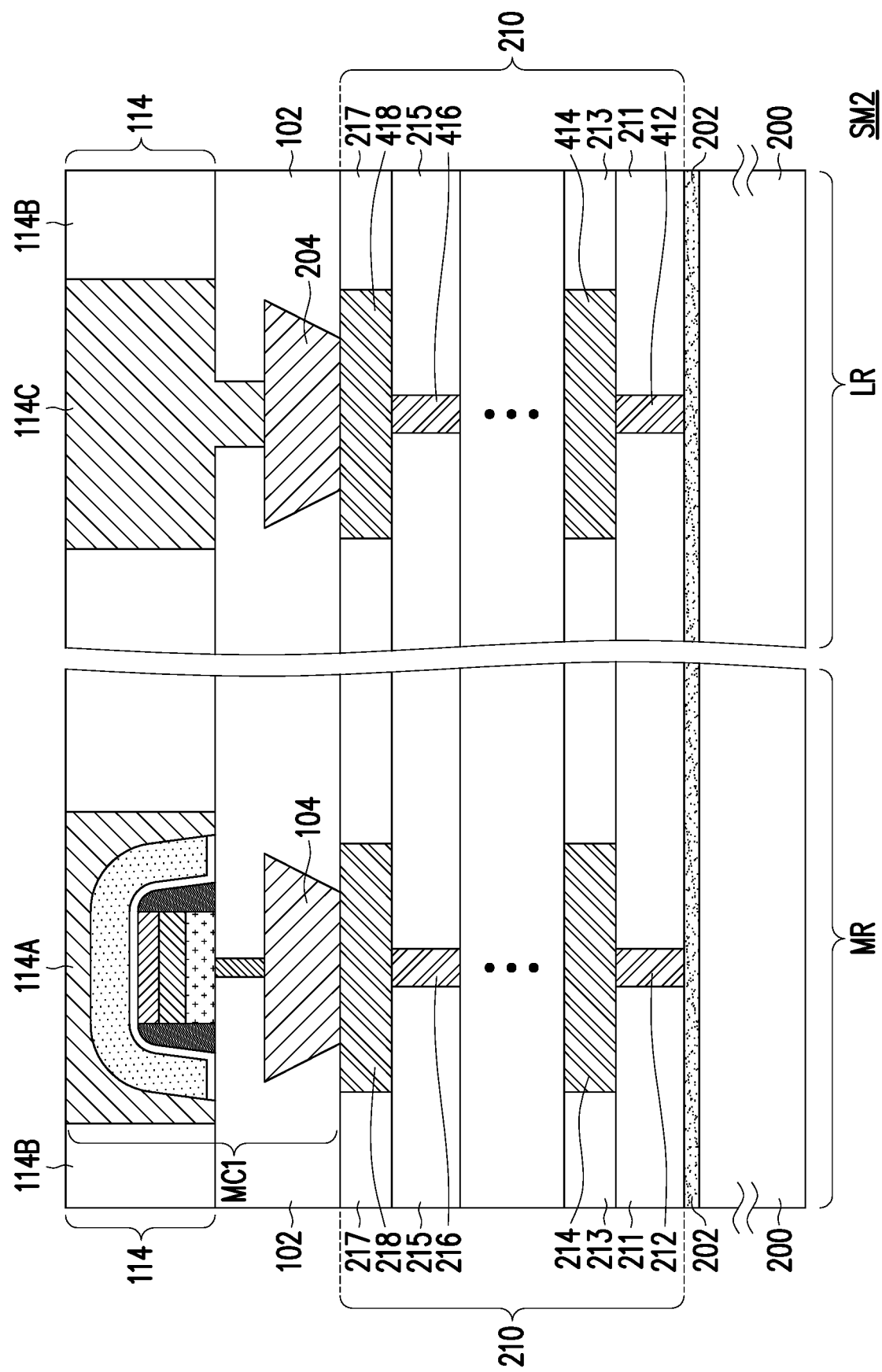
FIG. 14 is a schematic sectional view of a semiconductor device in accordance with some other embodiments of the present disclosure.

FIG. 14 is a schematic sectional view of a semiconductor device in accordance with some other embodiments of the present disclosure. The memory cell MC1 illustrated in the following embodiments is applied to, but not limited thereto, a RRAM cell. The structures, materials, and processes may be similar to what are shown in, and discussed referring to, FIG. 1 through FIG. 8. The details are thus no repeated herein. It is noted that other memory cells MC2, MC3, MC4 and MC5 may individually substitute the memory cell MC1 to form the semiconductor device of the example.

Referring to FIG. 14, a semiconductor device SM2 may include memory region MR and a logic region LR. In some embodiments, the memory region MR includes a substrate 200, a device region 202, a first interconnect structure 210, the memory cell MC1, and a second interconnect structure 114. In certain embodiments, the logic region LR includes the substrate 200, the device region 202, the first interconnect structure 210, the electrode layer 204 and the second interconnect structure 114.

In some embodiments, the substrate 200 is a semiconductor substrate, such as a bulk semiconductor, a semiconductor-on-insulator (SOI) substrate, or the like. The substrate 200 may be doped (e.g., with a p-type or an n-type dopant) or undoped. The substrate 200 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device region 202 is disposed on the substrate 200 in a front-end-of-line (FEOL) process. The device region 202 may include a wide variety of devices. In some alternative embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 202 includes a gate structure, source and drain regions, and isolation structures such as shallow trench isolation (STI) structures (not shown). In the device region 202, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 200. The functions of the devices may include memory, processors, sensors, amplifiers, power distribution, input/output circuitry, or the like.

As illustrated in FIG. 14, the first interconnect structure 210 in the memory region MR is disposed on the device region 202, and the device region 202 is disposed between the substrate 200 and the first interconnect structure 210. In some embodiments, the first interconnect structure 210 includes a plurality of build-up layers (M1 to Mx-1, where x is a positive integer of 3 or greater; not labeled) formed with insulating layers and conductive layers. In detail, the first interconnect structure 210 at least includes insulating layers 211, 213, 215, 217, conductive vias 212, 216, and conductive layers 214, 218. The conductive via 212 is disposed on and electrically connected to the device region 202. The conductive layer 214 is disposed on and electrically connected to the conductive via 212. The insulating layers 211, 213 are collectively referred to as an IMD layer laterally wrapping the conductive via 212 and the conductive layer 214 to constitute a build-up layer M1. On the other hand, the conductive layer 218 is disposed on and electrically connected to the conductive via 216. The insulating layers 215, 217 are collectively referred to as an IMD layer laterally wrapping the conductive via 216 and the conductive layer 218 to constitute another build-up layer Mx-1. As shown in FIG. 14, the build-up layer M1 (211, 212, 213 214) is electrically connected to the build-up layer Mx-1 (215, 216, 217, 218) through other build-up layer(s) (not shown), for example. Alternatively, the build-up layer M1 (211, 212, 213 214) may be electrically connected to the build-up layer Mx-1 (215, 216, 217, 218), directly.

In a similar way, the first interconnect structure 210 in the logic region LR is disposed on the device region 202, and the device region 202 is disposed between the substrate 200 and the first interconnect structure 210. In some embodiments, the first interconnect structure 210 is electrically connected to the logic devices in the device region 202. In some embodiments, the first interconnect structure 210 in the logic region includes a plurality of build-up layers (M1' to Mn-1, where n is a positive integer of 3 or greater; not labeled) formed with insulating layers and conductive layers. In detail, the first interconnect structure 210 in the logic region LR at least includes insulating layers 211, 213, 215, 217, conductive vias 412, 416, and conductive layers 414, 418. The conductive via 412 is disposed on and electrically connected to the device region 202. The conductive layer 414 is disposed on and electrically connected to the conductive via 412. The insulating layers 211, 213 are laterally wrapping the conductive via 412 and the conductive layer 414 to constitute a build-up layer M1'. On the other hand, the conductive layer 418 is disposed on and electrically connected to the conductive via 416. The insulating layers 215, 217 are laterally wrapping the conductive via 416 and the conductive layer 418 to constitute another build-up layer Mn-1. As shown in FIG. 14, the build-up layer M1' (211, 213, 412, 414) is electrically connected to the build-up layer Mn-1 (215, 217, 416, 418) through other build-up layer(s) (not shown), for example. Alternatively, the build-up layer M1' (211, 213, 412, 414) may be electrically connected to the build-up layer Mn-1 (215, 217, 416, 418), directly.

As further illustrated in FIG. 14, the memory cell MC1 and the second interconnect structure 114 are stacked on the first interconnect structure 120 in order in the memory region MR. The memory cell MC1 is electrically connected the first interconnect structure 210 and the second interconnect structure 114. The second interconnect structure 114 in the memory region MR may include an insulating layer 114B and a connection layer 114A. The insulating layer 114B is referred to as an IMD layer laterally wrapping the connection layer 114A to constitute a build-up layer (not labelled) or a part of a build-up layer. The insulating layer 114B is disposed on the memory cell MC1 to cover the selector 110 (as shown in FIG. 8). The connection layer 114A is disposed in the insulating layer 114B to electrically connect to the top electrode 112 included in the memory cell MC1. Furthermore, the bottom electrode 104 of the memory cell MC1 is in contact and electrically connected to the conductive layer 218 of the first interconnect structure 210, and the top electrode 112 of the memory cell MC1 is in contact and electrically connected to the connection layer 114A of the second interconnect structure 114. The connection layer 114A may provide the voltage to the selector 110 for controlling the status of the memory cell MC1 (e.g. turning "on" or "off" the memory element 106). On the other hand, the conductive layer 218 and the connection layer 114A may provide the voltages to the memory element 106 of the memory cell MC1 for operating the memory functions thereof. In other embodiments, one of the memory cells MC2, MC3, MC4 or MC5 are used to replace the memory cell MC1.

Furthermore, in some embodiments, the electrode layer 204 and the second interconnect structure 114 are stacked on the first interconnect structure 120 in order in the logic region LR. The electrode layer 204 is electrically connected to the first interconnect structure 210 and the second interconnect structure 114. The second interconnect structure 114 in the logic region LR may include an insulating layer 114B and a connection layer 114C. The insulating layer 114B is referred to as an IMD layer laterally wrapping the connection layer 114C to constitute a build-up layer (not labelled) or a part of a build-up layer. In some embodiments, the connection layer 114C of the logic region LR is located at the same level with the connection layer 114A of the memory region LR. In certain embodiments, the electrode layer 204 of the logic region LR is located at the same level with the bottom electrode 104 of the memory cell MC1 in the memory region MR.

In some embodiments, the insulating layers 211, 213, 215, 217 and 114B are independently made of a dielectric material, such as silicon oxide, silicon nitride, silicon oxynitride, a spin-on dielectric material, or a low-k dielectric material. The conductive layers 214, 218, 414, 418 and the connection layers 114A, 114C each may be a conductive trace/line/wire. The conductive layers 214, 218, 414, 418, the connection layers 114A, 114C and the conductive vias 212, 216, 412, 416 may independently include metals or metal alloys including one or more of Al, AlCu, Cu, Ti, TiN, W, or the like. The conductive layers 214, 218 and the connection layer 114A are a portion of a current driving circuit (not shown) to provide voltages to the memory cell MC1. In some embodiments, the conductive vias 212, 216, 412, 416 and the conductive layers 214, 218, 414, 418 are formed by a dual damascene process. That is, the conductive vias 212, 216, 412, 416 and the conductive layers 214, 218, 414, 418 may be formed simultaneously. In some embodiments, the memory cell MC1 may be disposed between any two adjacent conductive layers in the back-end-of-line (BEOL) structure. In certain embodiments, the fabricating process of the memory cell MC1 may be compatible with the BEOL process of the semiconductor device, thereby simplifying process steps and efficiently improving the integration density.

Figure 15:
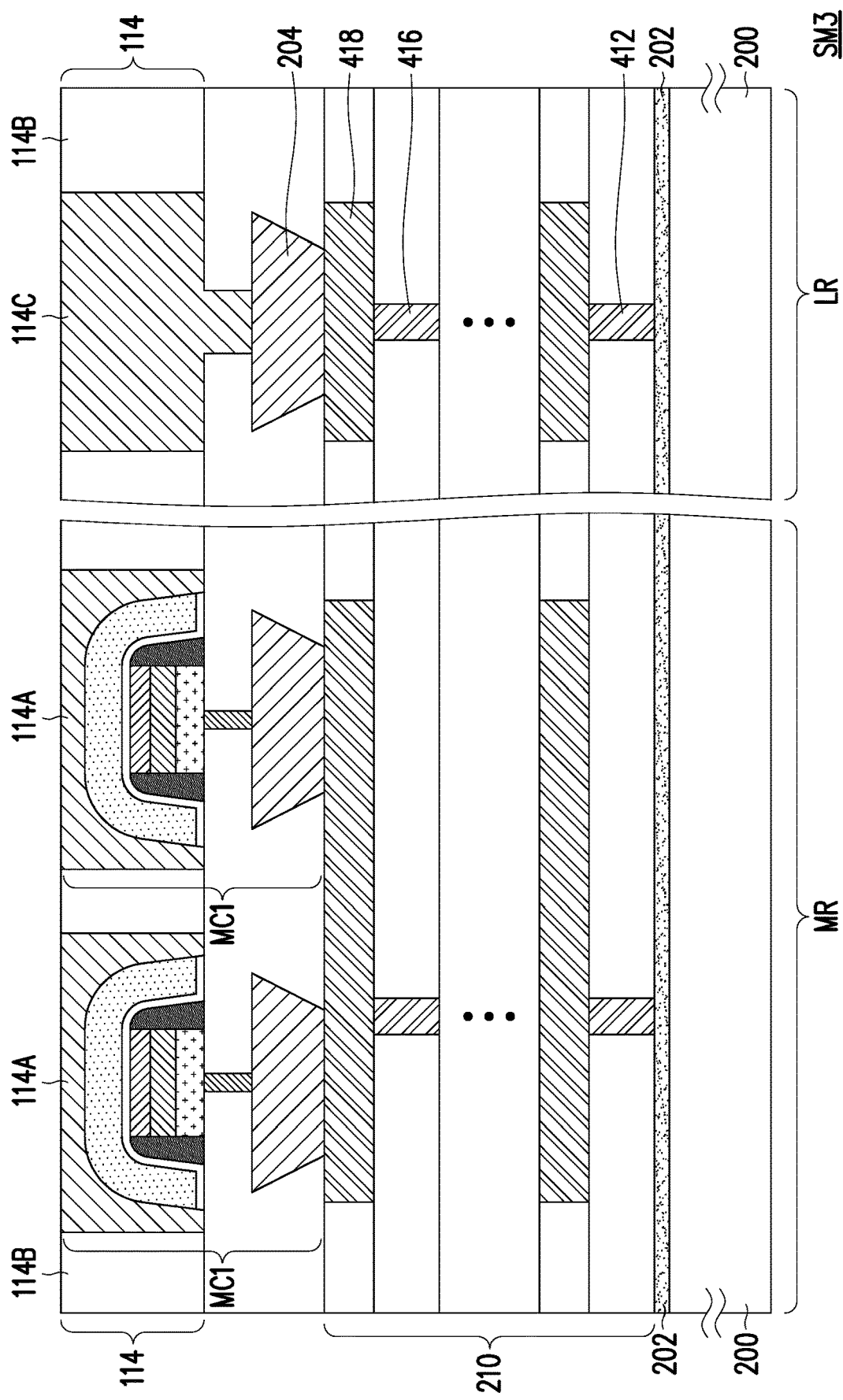
FIG. 15 is a schematic sectional view of a semiconductor device in accordance with some other embodiments of the present disclosure.

FIG. 15 is a schematic sectional view of a semiconductor device in accordance with some other embodiments of the present disclosure. The semiconductor device SM3 illustrated in FIG. 15 is similar to the semiconductor device SM2 illustrated in FIG. 14. Therefore, the same reference numerals are used to refer to the same or liked parts, and its detailed description will be omitted herein. The difference between the embodiments is that a plurality of memory cells MC1 is illustrated in the semiconductor device SM3 of FIG. 15. For example, as illustrated in FIG. 15, two memory cells MC1 are located in between the first interconnection structure 210 and the second interconnection structure 114 in the memory region MR. In some embodiments, the two memory cells MC1 are electrically coupled to one another through the first interconnection structure 210. The two memory cells MC1 may correspond to the memory cell MC1 illustrated in FIG. 8, thus its detailed description will be omitted herein.

Although two identical memory cells MC1 are illustrated herein, it is appreciated that two identical memory cells (e.g. MC1, MC2, MC3, MC4 or MC5) or two different memory cells (e.g. MC1, MC2, MC3, MC4 and MC5) may be included in the semiconductor device. For example, a semiconductor device may include a memory cell MC1 and a memory cell MC2; the semiconductor device may include a memory cell MC1 and a memory cell MC3; the semiconductor device may include a memory cell MC1 and a memory cell MC4; the semiconductor device may include a memory cell MC1 and a memory cell MC5; the semiconductor device may include a memory cell MC2 and a memory cell MC3; the semiconductor device may include a memory cell MC2 and a memory cell MC4; the semiconductor device may include a memory cell MC2 and a memory cell MC5; the semiconductor device may include a memory cell MC3 and a memory cell MC4; the semiconductor device may include a memory cell MC3 and a memory cell MC5; or the semiconductor device may include a memory cell MC4 and a memory cell MC5. Furthermore, the number of memory cells (MC1, MC2, MC3, MC4 and MC5) located in the memory region MR of the semiconductor device is not limited to one or two, but can be three or more. In case where a plurality of memory cells (MC1, MC2, MC3, MC4 and MC5) exist in the semiconductor device, the memory cells (MC1, MC2, MC3, MC4 and MC5) may be used alone (all the same type of memory cells), or be used in combination (different types of memory cells).

In the above-mentioned embodiments, the dimensions of the memory element in each memory cell are scaled down, and a small contact area is provided between the first and second conductive layers of the memory element, which is in favor of high electrical current delivery performance for memory operation, and to achieve high pattern density. By designing the memory element in such a small scale, the selector may be formed over and around the memory element in the same film layer through a self-aligned process. As such, high density memory cells with high operation current may be achieved, while the manufacturing costs and processing steps may be reduced (high wafer per hour (WPH)). Furthermore, in each of the memory cells, spacers are surrounding the memory cell and used to separate the selector from the storage layer. This helps to protect the device during prolonged quenching time (Q time) of the manufacturing process.

In accordance with some embodiments of the present disclosure, a memory cell includes a bottom electrode, a memory element, spacers, a selector and a top electrode. The memory element is located on the bottom electrode and includes a first conductive layer, a second conductive layer and a storage layer. The first conductive layer is electrically connected to the bottom electrode. The second conductive layer is located on the first conductive layer, wherein a width of the first conductive layer is smaller than a width of the second conductive layer. The storage layer is located in between the first conductive layer and the second conductive layer. The spacers are located aside the second conductive layer and the storage layer. The selector is disposed on the spacers and electrically connected to the memory element. The top electrode is disposed on the selector.

In accordance with some other embodiments of the present disclosure, a semiconductor device includes a first interconnect structure, a memory cell, and a second interconnect structure. The first interconnect structure is disposed on a substrate. The memory cell is disposed on the first interconnect structure, wherein the memory cell includes a bottom electrode, a memory element, a selector, first and second spacers and a top electrode. The bottom electrode is connected to the first interconnect structure. The memory element is disposed on the bottom electrode. The selector is disposed on the memory element, wherein the selector comprises a cap portion covering a top surface of the memory element and side portions covering the sidewalls of the memory element. The first and second spacers are disposed on two opposing sides of the memory element and covered by the side portions of the selector. The top electrode is disposed on and covering the selector. The second interconnect structure is disposed on the memory cell and electrically connected to the top electrode.

In accordance with yet another embodiment of the present disclosure, a method of forming a memory cell is described. The method includes the following steps. A bottom electrode is provided. A memory element is formed on the bottom electrode, wherein forming the memory element comprises: forming a first conductive layer electrically connected to the bottom electrode; forming a storage layer on the first conductive layer; forming a second conductive layer on the storage layer, wherein the storage layer is located in between the second conductive layer and the first conductive layer, and a width of the first conductive layer is smaller than a width of the second conductive layer. Spacers are formed to be located aside the second conductive layer and the storage layer. A selector is formed on the spacers, wherein the selector is electrically connected to the memory element. A top electrode is formed on the selector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
   a bottom electrode;
   a memory element located on the bottom electrode, wherein the memory element comprises:
      a first conductive layer electrically connected to the bottom electrode;
      a second conductive layer located on the first conductive layer, wherein a width of the first conductive layer is smaller than a width of the second conductive layer; and
      a storage layer located in between the first conductive layer and the second conductive layer;
   spacers located aside the second conductive layer and the storage layer;
   a selector disposed on the spacers and electrically connected to the memory element; and
   a top electrode disposed on the selector.

2. The memory cell according to claim 1, further comprising a metal mask layer disposed on the second conductive layer, and located in between the selector and the second conductive layer.

3. The memory cell according to claim 2, wherein the selector conformally covers the spacers and the metal mask layer.

4. The memory cell according to claim 3, wherein sidewalls of the metal mask layer are aligned with sidewalls of the storage layer and sidewalls of the second conductive layer.

5. The memory cell according to claim 1, wherein the width of the second conductive layer is smaller than a minimum width of the bottom electrode.

6. The memory cell according to claim 1, further comprising a dielectric layer surrounding the bottom electrode and the first conductive layer of the memory element, wherein a top surface of the dielectric layer is coplanar with a top surface of the first conductive layer.

7. The memory cell according to claim 1, wherein the selector comprises an ovonic threshold switch material.

8. A semiconductor device, comprising:
a first interconnect structure disposed on a substrate;
a memory cell disposed on the first interconnect structure, wherein the memory cell comprises:
a bottom electrode connected to the first interconnect structure;
a memory element disposed on the bottom electrode; and
a selector disposed on the memory element, wherein the selector comprises a cap portion covering a top surface of the memory element and side portions covering the sidewalls of the memory element;
first and second spacers disposed on two opposing sides of the memory element and covered by the side portions of the selector; and
a top electrode disposed on and covering the selector; and
a second interconnect structure disposed on the memory cell and electrically connected to the top electrode.

9. The semiconductor device according to claim 8, further comprising a dielectric layer disposed on the first interconnect structure, wherein the dielectric layer surrounds the bottom electrode and portions of the memory element.

10. The semiconductor device according to claim 9, wherein the second interconnect structure comprises an insulating layer and a connection layer, the insulating layer is in contact with the dielectric layer, and the connection layer is electrically connected to the top electrode.

11. The semiconductor device according to claim 8, wherein the selector further comprises flank portions joined with the side portions, and bottom surfaces of the flank portions are aligned with bottom surfaces of the first and second spacers.

12. The semiconductor device according to claim 11, wherein the top electrode is disposed on and in contact with the cap portion, the side portions and the flank portions of the selector.

13. The semiconductor device according to claim 8, wherein the memory element comprises:
a first conductive layer electrically connected to the bottom electrode;
a storage layer disposed on the first conductive layer; and
a second conductive layer disposed on the storage layer, wherein the first and second spacers cover sidewalls of the storage layer and sidewalls of the second conductive layer, and are physically separated from the first conductive layer.

14. The semiconductor device according to claim 13, wherein lateral dimensions of the first conductive layer, the storage layer and the second conductive layer are smaller than a lateral dimension of the bottom electrode.

15. The semiconductor device according to claim 8, wherein the memory cell further comprises a second memory element disposed in between the memory element and the bottom electrode, and the second memory element comprises:
a first conductive layer electrically connected to the bottom electrode;
a storage layer disposed on the first conductive layer; and
a second conductive layer disposed on the storage layer.

16. A method of forming a memory cell, comprising:
providing a bottom electrode;
forming a memory element on the bottom electrode, wherein forming the memory element comprises:
forming a first conductive layer electrically connected to the bottom electrode;
forming a storage layer on the first conductive layer;
forming a second conductive layer on the storage layer, wherein the storage layer is located in between the second conductive layer and the first conductive layer, and a width of the first conductive layer is smaller than a width of the second conductive layer;
forming spacers located aside the second conductive layer and the storage layer;
forming a selector on the spacers, wherein the selector is electrically connected to the memory element; and
forming a top electrode on the selector.

17. The method according to claim 16, further comprising:
forming a dielectric layer covering the bottom electrode;
forming an opening in the dielectric layer revealing a top surface of the bottom electrode; and
forming the first conductive layer in the opening so that a top surface of the first conductive layer is coplanar with a top surface of the dielectric layer.

18. The method according to claim 17, wherein the selector is conformally formed over the dielectric layer, the spacers and over the memory element, and the top electrode is conformally formed over the selector.

19. The method according to claim 16, wherein the selector is formed with a cap portion covering a top surface of the memory element, side portions covering sidewalls of the memory element, and flank portions joined with the side portions, and bottom surfaces of the flank portions are aligned with bottom surfaces of the spacers.

20. The method according to claim 19, wherein the top electrode is formed on and in contact with the cap portion, the side portions and the flank portions of the selector, and a patterning process is performed to partially remove the flank portions of the selector, and partially remove the top electrode located on the flank portions.

* * * * *